US007022577B2

(12) United States Patent
Meyyappan

(10) Patent No.: US 7,022,577 B2
(45) Date of Patent: Apr. 4, 2006

(54) METHOD OF FORMING ULTRA SHALLOW JUNCTIONS

(75) Inventor: Narayanan Meyyappan, Penang (MY)

(73) Assignee: Silterra Malaysia Sdn. Bhd., (MY)

( * ) Notice: Subject to any disclaimer, the term of this patent is extended or adjusted under 35 U.S.C. 154(b) by 0 days.

(21) Appl. No.: 10/864,030

(22) Filed: Jun. 8, 2004

(65) Prior Publication Data

US 2004/0224488 A1 Nov. 11, 2004

Related U.S. Application Data

(63) Continuation of application No. 10/300,117, filed on Nov. 19, 2002, now Pat. No. 6,767,809.

(51) Int. Cl.
*H01L 21/336* (2006.01)

(52) U.S. Cl. ...................... 438/307; 438/529; 438/305; 438/306

(58) Field of Classification Search ................ 438/217, 438/232, 276, 289, 305, 303; 365/369; 250/423 R
See application file for complete search history.

(56) References Cited

U.S. PATENT DOCUMENTS

| | | | | |
|---|---|---|---|---|
| 4,804,852 | A * | 2/1989 | Rose et al. | 250/492.1 |
| 4,942,342 | A * | 7/1990 | Tsukakoshi | 315/410 |
| 5,311,028 | A * | 5/1994 | Glavish | 250/492.21 |
| 6,150,243 | A * | 11/2000 | Wieczorek et al. | 438/558 |
| 6,162,690 | A * | 12/2000 | Lee | 438/300 |
| 6,391,733 | B1 * | 5/2002 | Fisher | 438/305 |
| 6,624,037 | B1 * | 9/2003 | Buynoski et al. | 438/305 |
| 6,664,547 | B1 * | 12/2003 | Benveniste | 250/423 R |
| 6,673,663 | B1 * | 1/2004 | Wu et al. | 438/217 |
| 6,808,997 | B1 * | 10/2004 | Jain et al. | 438/305 |
| 6,858,462 | B1 * | 2/2005 | Zaidi et al. | 438/71 |
| 2001/0049173 | A1 * | 12/2001 | Wu et al. | 438/303 |
| 2002/0074612 | A1 * | 6/2002 | Bulucea et al. | 257/402 |
| 2003/0013282 | A1 * | 1/2003 | Hsieh et al. | 438/514 |
| 2004/0085538 | A1 * | 5/2004 | Hovinen et al. | 356/369 |

* cited by examiner

*Primary Examiner*—David Zarneke
*Assistant Examiner*—Victor V. Yevsikov
(74) *Attorney, Agent, or Firm*—Townsend and Townsend and Crew LLP

(57) ABSTRACT

The present invention relates to a method of fabricating a semiconductor device. In specific embodiments, the method comprises providing a semiconductor substrate, and ion implanting dopant impurities over a time period into the semiconductor device by varying an ion energy of implanting the dopant impurities over the time period. The dopant impurities are activation annealed to form one or more doped regions extending below the surface of the semiconductor substrate. The ion energy may be varied continuously or in a stepwise manner over the time period, and may also be varied in a cyclical manner.

12 Claims, 4 Drawing Sheets

METHOD OF FORMING ULTRA SHALLOW JUNCTIONS

CROSS-REFERENCES TO RELATED APPLICATIONS

Not Applicable

BACKGROUND OF THE INVENTION

The present invention relates generally to semiconductor manufacturing and, more particularly, to a method of forming ultra shallow junctions.

The escalating need for high densification and performance associated with large scale integrated semiconductor device requires design features of 0.25 microns and under, increased transistor and circuit speeds, high reliability, and increased manufacturing throughput. The reduction of design features to 0.25 micron and under challenges the limitations of conventional semiconductor manufacturing techniques.

As design features continue to shrink below 0.25 micron, it is necessary to significantly reduce the depth of the source and drain regions below the surface of the semiconductor substrate of a typical MOS transistor, particularly the source/drain regions (i.e., the junction depth). The conventional method of forming such junctions involve ion implanting boron as p-type dopants for the source/drain or ion implanting arsenic or phosphorous as n-type dopants for the source/drain. The implantation is performed at very low energy levels to achieve a shallow junction depth. Because boron is an extremely light element, it is implanted at a very low energy. With a polysilicon gate width of 0.25 micron, the junction depth should be on the order of 800 Å. The ion energy for implanting boron is typically about 5 KeV. The resulting structure is then activation annealed, typically at about 800–1000° C. to cause activation of the boron dopant to form the source and drain regions.

Achievement of a small junction depth is problematic, especially for a p+ region formed using boron ions. It has been found that during dopant activation anneal, boron diffusion in the crystalline silicon layer is significantly large, so that the junction depth of the boron tends to be much deeper than planned. The problem becomes more critical as the design features shrink to 0.18 micron or 0.13 micron and below.

The problem of undefined dopant junction depth is believed to stem from various factors. For example, boron implantation is known to damage the monocrystalline silicon substrate generating interstitial atoms of silicon, i.e., silicon atoms that are displaced from the monocrystalline lattice to occupy spaces between silicon atoms in the monocrystalline lattice. During the high temperature activation anneal, boron diffuses into the monocrystalline silicon layer by attaching to the generated interstitial silicon atoms, causing an extremely rapid diffusion of boron into the monocrystalline silicon layer. Such a rapid boron diffusion causes the dopant profile and hence the junction depth to extend below the targeted maximum, despite the low initial implantation energy. This has been referred to as the transient enhanced diffusion (TED).

One approach to reduce or eliminate TED is to form an amorphous layer from the surface to a certain depth in the monocrystalline silicon by ion implanting germanium or silicon. Boron is then ion implanted into this amorphous silicon region. Subsequent annealing at high temperature avoids TED of boron due to the lack of interstitials. The amorphous silicon is recrystallized to monocrystalline silicon by solid phase epitaxy during activation annealing. The junction depth is controlled by selecting the appropriate ion implantation energy of boron.

To form the amorphous layer, a very high dose of Ge or Si has to be implanted. At such high doses, significant crystal damage is done to the silicon. It was found that the end-of-range damage remains upon crystallization of the surface amorphous region during activation annealing. The damage includes defects such as dislocations and stacking faults. The end-of-range defects in a subsequently formed depletion layer cause junction leakage, resulting in poor transistor performance. See U.S. Pat. Nos. 6,008,098 and 6,074,937.

BRIEF SUMMARY OF THE INVENTION

The present invention relates to a method of forming ultra shallow junctions having depths of 800 Å or less without requiring pre-amorphization implant thereby eliminating the end-of-range damage. In specific embodiments, the method involves implanting impurities such as boron ions into silicon and distributing the silicon interstitials within the desired junction depth to which the boron ions attach. This is accomplished by varying the ion implantation energy for implanting the impurities and maintaining the same dose. The maximum ion energy level is chosen to achieve the desired junction depth, while the minimum ion energy level is selected to achieve a desired distribution of the dopant impurities over the junction depth (e.g., a lower minimum ion energy will shift the concentration to a region close to the surface). Varying the ion energy produces more uniform interstitials and damage to the silicon substrate, and avoids the concentration of damage at a fixed depth. The more uniform distribution of interstitials and damage allows a reduction of the activation annealing temperature to activate the dopant impurities and remove the damage to the substrate. The lower anneal temperature reduces the thermal budget which is desirable particularly for shrinking device dimensions.

In accordance with an aspect of the present invention, a method of fabricating a semiconductor device comprises providing a semiconductor substrate, and ion implanting dopant impurities over a time period into the semiconductor device by varying an ion energy of implanting the dopant impurities over the time period. The dopant impurities are activation annealed to form one or more doped regions extending below the surface of the semiconductor substrate.

In some embodiments, the ion energy is varied continuously over the time period. The ion energy may be varied between a minimum energy level and a maximum energy level. The maximum energy level is selected to achieve a depth of the doped region which is smaller than a preset maximum depth. The minimum energy level is selected to achieve a desired distribution of the dopant impurities over a depth of the doped region. The ion energy may be varied cyclically during the time period. The ion energy may be varied in a stepwise manner over the time period. The dopant impurities may include boron ions. The activation annealing may be performed at a temperature of less than about 1000° C.

In accordance with another aspect of the invention, a method of fabricating a semiconductor device comprises providing a silicon substrate having a gate electrode and a gate oxide layer disposed thereon. Dopant impurities are ion implanted over a time period in the semiconductor device by varying an ion energy of implanting the dopant impurities over the time period. The method further includes activation annealing the dopant impurities to form doped source/drain regions extending below the surface of the silicon substrate on opposite sides of the gate electrode and gate oxide layer disposed thereon.

In accordance with another aspect of the present invention, a method of fabricating a semiconductor device comprises providing an ion implanter and providing a semiconductor substrate. Dopant impurities are ion implanted over a time period into the semiconductor device by varying an ion energy of the ion implanter and maintaining a direction of an ion beam of the ion implanter toward the semiconductor substrate to implant the dopant impurities over the time period. The method further includes activation annealing the dopant impurities to form one or more doped regions extending below the surface of the semiconductor substrate.

In some embodiments, the ion implanter includes an ion mass analyzer magnet current which is adjusted to maintain the purity and direction of the ion beam of the ion implanter toward the semiconductor substrate to implant the dopant impurities over the time period. In some other embodiments, the ion implanter includes a final energy magnet current which is adjusted to maintain the direction of the ion beam of the ion implanter toward the semiconductor substrate to implant the dopant impurities over the time period.

DETAILED DESCRIPTION OF THE INVENTION

Figure 1:
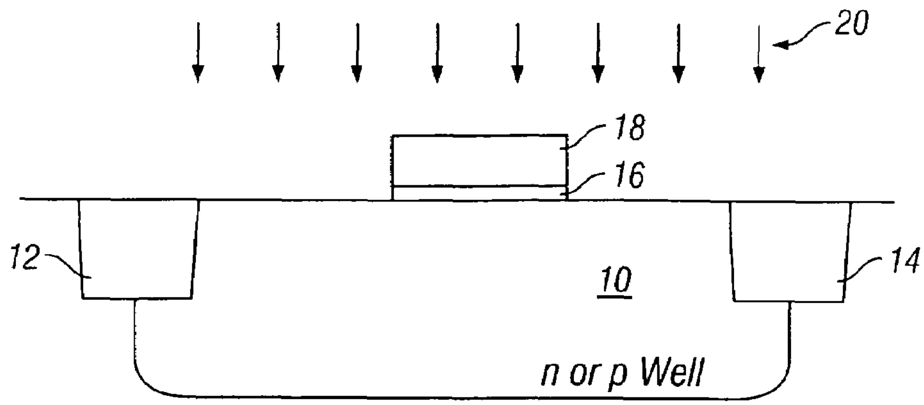
FIG. 1 is a simplified elevational view of a semiconductor device including a gate oxide and a gate electrode.

FIG. 1 shows an n-type silicon substrate 10 having shallow trench isolation (STI) regions 12, 14 and a dielectric layer 16 formed using a well-known process. The STI regions may be replaced by other types of isolation regions in other embodiments, such as field oxide regions and the like. A layer of conductive material, such as polycrystalline silicon, is formed on the dielectric layer 16, and patterned to form the gate electrode 18 over the gate oxide layer 16. The n-type silicon substrate is used to generate a PMOS transistor. It is understood that an NMOS transistor may be produced by using a different doping scheme in other embodiments.

Figure 2:
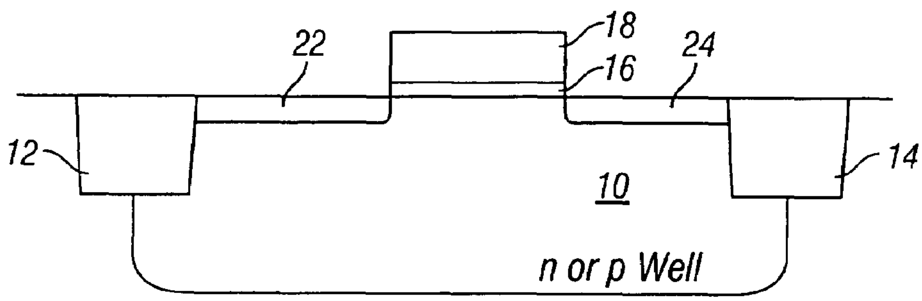
FIG. 2 is a simplified elevational view of the semiconductor device of FIG. 1 showing formation of doped source and drain regions according to an embodiment of the present invention.

After formation of the gate oxide 16 and gate electrode 18, dopant impurities such as boron ions 20 are implanted, as shown in FIG. 1. The implant dosage is typically on the order of about 1E14 $cm^{-2}$ to about 1E16 $cm^{-2}$. For a polysilicon gate width of 0.25 micron, the desired junction depth is typically on the order of 800 Å. The ion energy is varied between a minimum level and a maximum level. In specific embodiments, the minimum ion energy is about 1.5 KeV and the maximum ion energy is about 3.5 KeV. The ion implantation is performed for a time period to achieve the desired implant dosage. Next, the resulting structure is annealed to cause the dopant impurities to activate to form shallow, doped source and drain regions 22, 24, as seen in FIG. 2.

Figure 3:
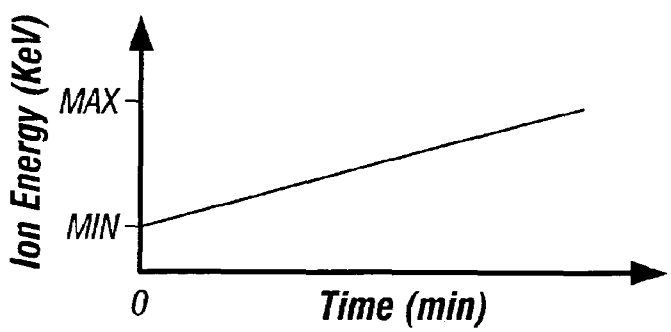
FIG. 3 is a plot of a varying ion energy profile according to one embodiment of the invention.
Figure 4:
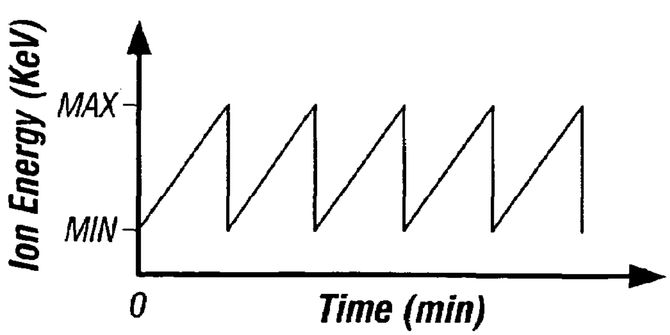
FIG. 4 is a plot of a sawtooth ion energy profile according to another embodiment of the invention.

In one embodiment, the ion energy is varied continuously over the time period of ion implantation between the minimum energy level and the maximum energy level. The maximum energy level is selected to achieve a junction depth of the doped source/drain regions which is smaller than a preset maximum depth (e.g., about 800 Å). The minimum energy level is selected to achieve a desired dopant distribution over the depth of the doped regions. The ion energy may be varied in a linear manner or a nonlinear manner over time. In some cases, the ion energy may be increased continuously from the minimum energy level to the maximum energy level over the time period, as shown in FIG. 3. In other cases, the ion energy variation may be cyclical. For example, FIG. 4 shows a sawtooth profile in which the ion energy is ramped up from the minimum energy level to the maximum energy level and dropped back to the minimum energy level over a portion of the time period, and the energy profile is repeated over the entire implantation time period.

Figure 5:
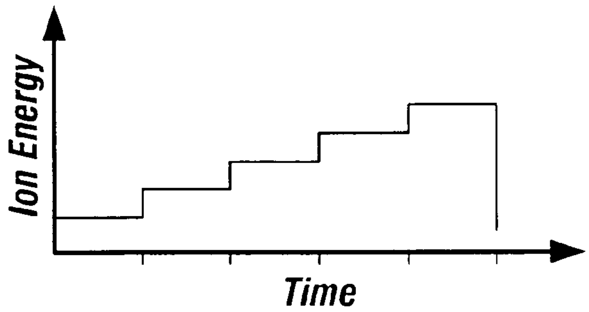
FIG. 5 is a plot of a stepwise ion energy profile according to another embodiment of the invention.

In another embodiment, the ion energy is varied in a stepwise manner. FIG. 5 shows an example of increasing the ion energy from the minimum energy level to the maximum energy level over five steps in the implantation time period. This can be easily accomplished in implanters such as PSII (plasma source ion implantation) or PIII (plasma immersion ion implantation) apparatuses by changing the ion energy of the DC voltage by linear ramping. Of course, different stepwise patterns may be employed in different embodiments, and a cyclical step pattern may be used in some embodiments.

Figure 6A:
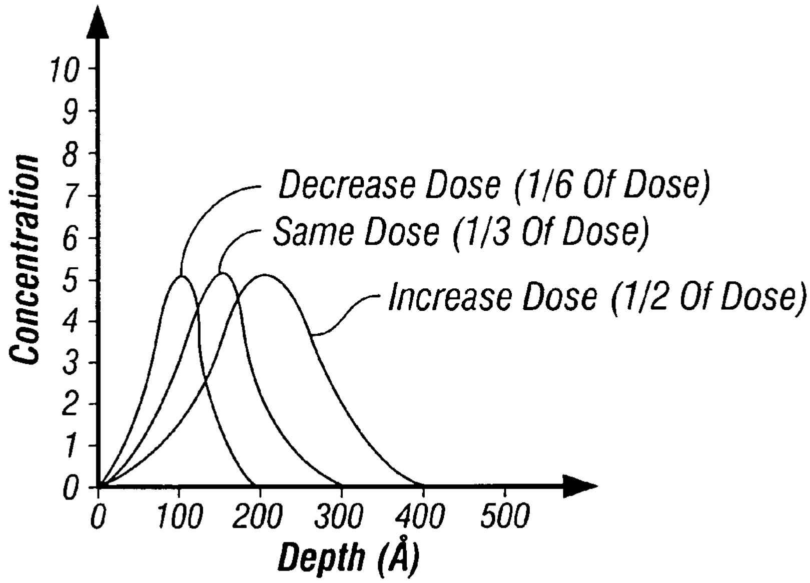
FIGS. 6A–6C show plots of the dopant concentration versus substrate depth for three doping schemes.
Figure 6B:
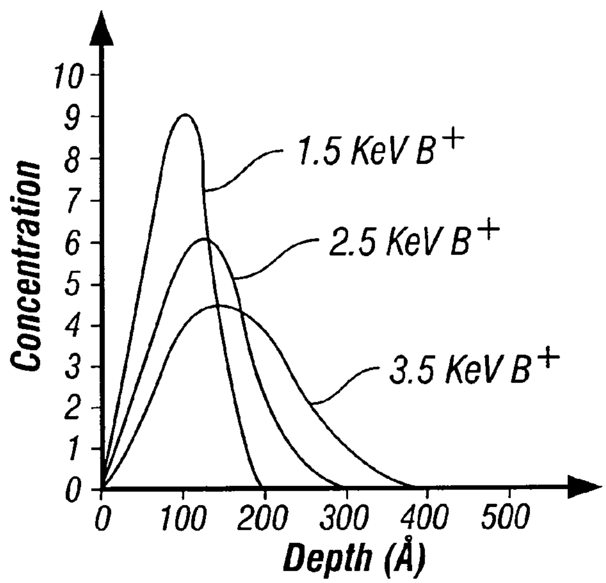
Figure 6C:
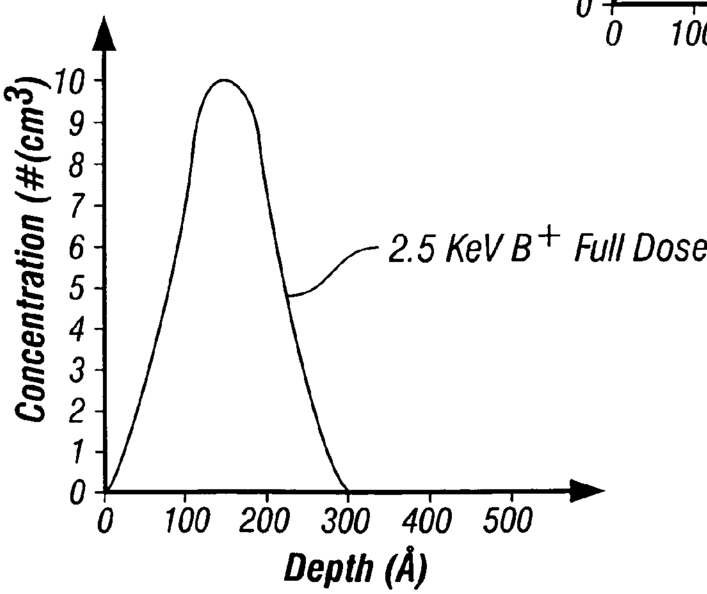

FIGS. 6A–6C show plots of the dopant concentration versus substrate depth for three doping schemes. FIGS.

Figure 7A:
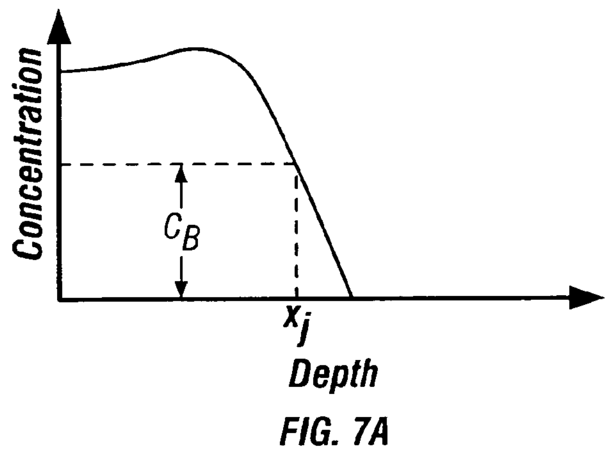
FIGS. 7A–7C show plots of the dopant concentration versus substrate depth after anneal for the three doping schemes of FIGS. 6A–6C.
Figure 7B:
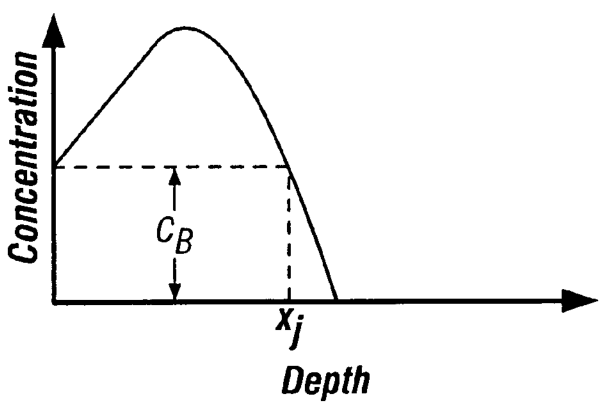
Figure 7C:
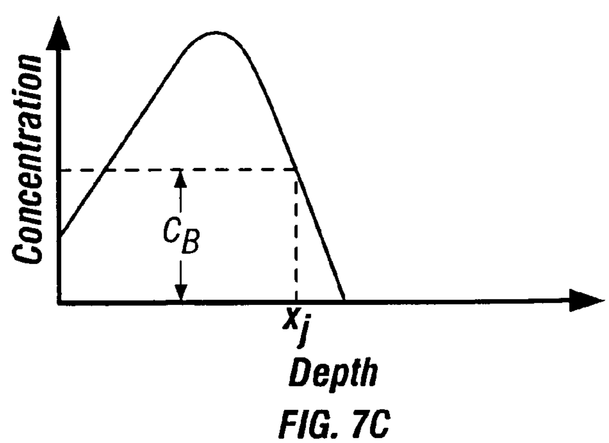

7A–7C show plots of the dopant concentration versus substrate depth after anneal for the three doping schemes of FIGS. 6A–6C. In FIG. 6C, a conventional approach applies the full dose which produces a dopant concentration profile that does not have an abrupt junction, as shown in FIG. 7C. FIG. 6B shows the full dosage split into three equal doses (⅓ each) and applied over time. The dopant concentration profile that results is improved, but still does not achieve the desired abrupt junction, as seen in FIG. 7B. Employing the ion implanting method of the present invention as described above (step dose split or fixed energy steps), the dopant concentration plot of FIG. 6A is obtained. In this example, the three dosage curves include about ½ of dose for the deep curve, about ⅙ of dose for the shallow curve, and about ⅓ of dose for the intermediate curve. The ion energy is varied during ion implantation prior to anneal. The resulting dopant concentration has a more abrupt junction, as seen in FIG. 7A. Abrupt junctions are preferred for best transistor performance and operation (switching drive current). $C_B$ is the background doping concentration of the silicon substrate used to determine junction depth ($x_j$).

In the present invention, because the dopant impurities and the damage to the substrate are distributed more uniformly, the need to redistribute them by activation annealing after ion implantation is reduced. Consequently, a lower anneal temperature may be used to activate the dopant impurities and remove the damage. Activation annealing can be performed by RTA (rapid thermal annealing) or RTP (rapid thermal processing). The lower anneal temperature reduces the thermal budget which is desirable particularly for shrinking device dimensions. Upon activation anneal, typically at a temperature less than about 1000° C. (e.g., about 800–900° C.), the dopant concentration profile as illustrated in FIG. 7A is obtained.

Figure 8:
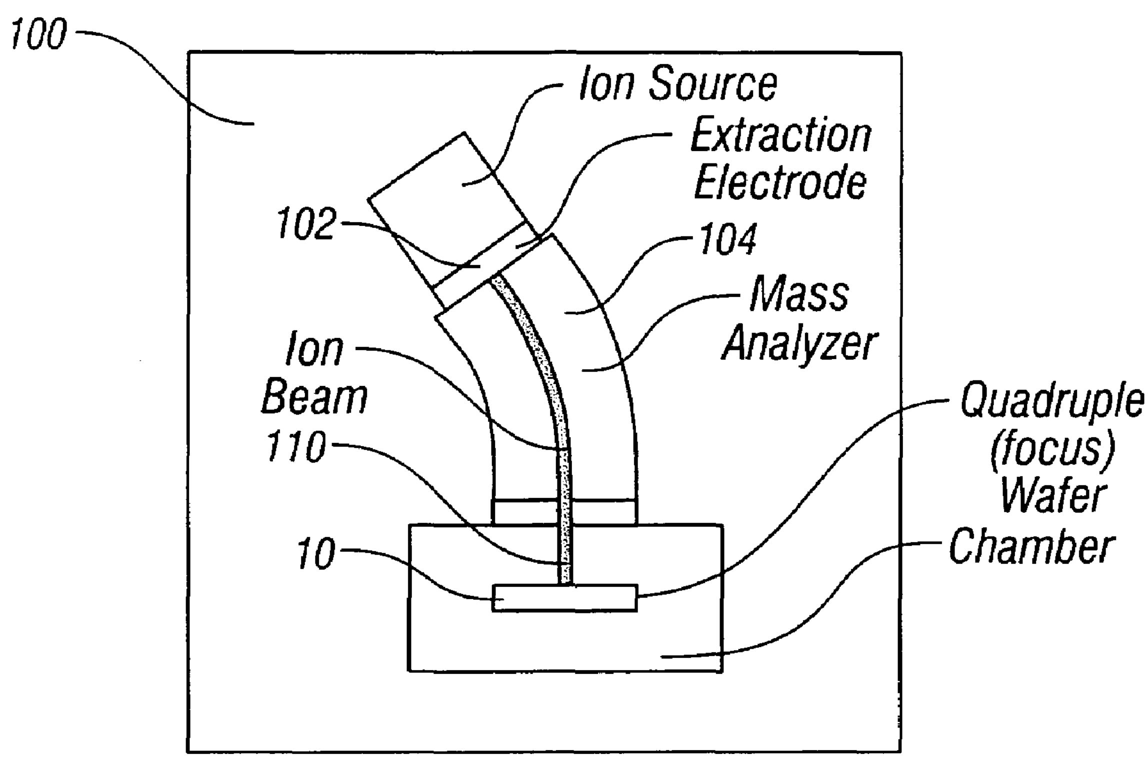
FIG. 8 is a simplified diagram of an ion implanter used for ion implanting impurities into the semiconductor device.

The ion implantation can be performed using ion implanters such as a high current or a medium current implanter, or a high energy implanter. Conventional ion implanters are configured to perform ion implantation at a fixed ion energy level. A typical ion implanter employs an ion mass analyzer having an ion mass analyzer magnet current that is also fixed. When the ion energy is varied during implantation, the ion beam will shift and the ion beam will no longer be focused onto the Faraday cup, causing the ion beam to shift away from the substrate. To keep the beam focused onto the Faraday cup and directed to the substrate, the ion mass analyzer magnet current will also have to be adjusted. For the stepwise pattern, the adjustment is made after each step. Some recent ion implanters are configured to adjust the ion mass analyzer magnet current when the ion energy is changed from one fixed level to another fixed level. FIG. 8 is a simplified diagram of an ion implanter 100 which includes an ion energy control 102 and a magnet current control 104 for the ion mass analyzer. The controls 102, 104 are adjusted to ensure that the ion beam 110 is directed toward the substrate 10 for ion implanting impurities into the semiconductor device.

For the continuous varying pattern, the ion mass analyzer magnet current will be adjusted simultaneously with the varying ion energy level. While this may be done manually, it is preferable to provide a computer program to direct the computer controls in the ion implanter to adjust the ion energy voltage and ion mass analyzer magnet current to follow the desired energy profile while maintaining the ion beam focused onto the Faraday cup and directed to the substrate. In some high energy ion implanters, the final energy magnet (FEM) current instead of the ion mass analyzer magnet current will need to be adjusted to maintain the ion beam focused onto the Faraday cup and directed to the substrate when varying the ion energy level during ion implantation.

The above-described arrangements of apparatus and methods are merely illustrative of applications of the principles of this invention and many other embodiments and modifications may be made without departing from the spirit and scope of the invention as defined in the claims. For instance, the present invention may be used for implanting different impurities to form different regions in a variety of semiconductor devices. The scope of the invention should, therefore, be determined not with reference to the above description, but instead should be determined with reference to the appended claims along with their full scope of equivalents.

What is claimed is:

1. A method of fabricating a semiconductor device, the method comprising:

providing a semiconductor substrate defining a gate structure and first and second regions, each region being provided on one side the gate structure;

ion implanting dopant impurities over a first time period into the first and second regions of the semiconductor device with a first ion energy of implanting the dopant impurities over the first time period;

ion implanting the dopant impurities over a second time period into the first and second regions of the semiconductor device with a second ion energy of implanting the dopant impurities over the second time period;

ion implanting the dopant impurities over a third time period into the first and second regions of the semiconductor device with a third ion energy of implanting the dopant impurities over the third time period; and activation annealing the dopant impurities to form at least one doped region extending below the surface of the semiconductor substrate, wherein the three separate ion-implantation steps are performed to provide the first and second regions with ultra shallow junctions.

2. The method of claim 1 wherein the first ion energy is selected to achieve a depth of the at least one doped region which is smaller than a preset maximum depth.

3. The method of claim 1 wherein the third ion energy is selected to achieve a desired distribution of the dopant impurities over a depth of the at least one doped region.

4. The method of claim 1 wherein the first, second, and third energies are in the range of about 5.0 KeV to about 0.1 KeV.

5. The method of claim 1 wherein the dopant impurities comprise boron ions, wherein the dopant impurities are implanted into the same lateral regions of the substrate during the three separate ion-implantation steps, so that the lateral coverage of the dopant impurities implanted into the substrate is substantially the same for each of the three ion-implantation steps.

6. The method of claim 1 wherein the dopant impurities are ion implanted using an ion implanter which has an ion mass analyzer magnet current, and wherein an ion energy is varied by adjusting an ion energy level and the ion mass analyzer magnet current.

7. The method of claim 1 wherein the dopant impurities are ion implanted using an ion implanter which has a final energy magnet current, and wherein an ion energy is varied by adjusting an ion energy level and the final energy magnet current.

8. The method of claim 1 wherein the activation annealing is performed at a temperature of less than about 1000° C.

9. A method of fabricating a semiconductor device, the method comprising:

providing a silicon substrate having a gate electrode and a gate oxide layer disposed thereon;

ion implanting dopant impurities over a time period in the semiconductor device by varying an ion energy of implanting the dopant impurities over the time period, wherein the lateral coverage of the dopant impurities implanted into the substrate remain substantially the same while the ion implantation energy is varied over time; and activation annealing the dopant impurities to form doped source/drain regions extending below the surface of the silicon substrate on opposite sides of the gate electrode and gate oxide layer disposed thereon;

wherein the ion energy is varied in a sawtooth manner over the time period.

10. The method of claim 9 wherein the ion energy is varied between a minimum energy level and a maximum energy level selected to achieve a desired depth of the doped source/drain regions and a desired distribution of the dopant impurities in the doped source/drain regions.

11. The method of claim 9 wherein the dopant impurities comprise boron ions.

12. The method of claim 9, wherein the dopant impurities are implanted into the substrate by varying the ion implantation energy in order to more uniformly distribute the damage to the substrate, the damage to the substrate resulting from the implanting of the dopant impurities into the substrate.

* * * * *